US012000870B2

(12) United States Patent
Jaiswal et al.

(10) Patent No.: US 12,000,870 B2
(45) Date of Patent: Jun. 4, 2024

(54) MULTI-TERMINAL DEVICES USING MAGNETORESISTANCE ELEMENTS

(71) Applicant: Allegro MicroSystems, LLC, Manchester, NH (US)

(72) Inventors: Samridh Jaiswal, London (GB); Paolo Campiglio, Arcueil (FR); Sundar Chetlur, Frisco, TX (US); Maxim Klebanov, Palm Coast, FL (US); Yen Ting Liu, Hsinchu (TW)

(73) Assignee: Allegro MicroSystems, LLC, Manchester, NH (US)

( * ) Notice: Subject to any disclaimer, the term of this patent is extended or adjusted under 35 U.S.C. 154(b) by 108 days.

(21) Appl. No.: 17/931,197

(22) Filed: Sep. 12, 2022

(65) Prior Publication Data
US 2024/0085463 A1 Mar. 14, 2024

(51) Int. Cl.
*G01R 33/09* (2006.01)
*G01R 15/20* (2006.01)
*G01R 19/00* (2006.01)

(52) U.S. Cl.
CPC ....... *G01R 15/205* (2013.01); *G01R 19/0092* (2013.01)

(58) Field of Classification Search
CPC .............. G01R 31/343; G01R 31/1209; G01R 31/327; G01K 5/56; G01K 11/12
See application file for complete search history.

(56) References Cited

U.S. PATENT DOCUMENTS

| | | | | |
|---|---|---|---|---|
| 7,564,110 B2 * | 7/2009 | Beach | .................. | G11B 5/3173 365/158 |
| 9,425,387 B1 * | 8/2016 | Liu | ........................ | H10N 50/10 |
| 10,620,279 B2 | 4/2020 | Campiglio et al. | | |
| 10,868,240 B2 | 12/2020 | Liu et al. | | |
| 11,002,807 B2 | 5/2021 | Campiglio et al. | | |
| 11,022,661 B2 | 6/2021 | Lassalle-Balier et al. | | |
| 11,127,518 B2 | 9/2021 | Campiglio et al. | | |
| 11,175,359 B2 | 11/2021 | Lassalle-Balier et al. | | |
| 11,193,989 B2 * | 12/2021 | Campiglio | ......... | G01R 33/0052 |
| 11,217,626 B2 | 1/2022 | Campiglio et al. | | |
| 11,525,875 B2 | 12/2022 | Lassalle-Balier et al. | | |

(Continued)

OTHER PUBLICATIONS

Extended European Search Report dated Jan. 26, 2024 for European Application No. EP23188072.5; 10 pages.

(Continued)

*Primary Examiner* — Dominic E Hawkins
(74) *Attorney, Agent, or Firm* — Daly, Crowley, Mofford & Durkee, LLP

(57) ABSTRACT

In one aspect, a sensor includes a first metal layer portion and a second metal layer portion separated by an insulator material; a conductive material layer in electrical contact with the first metal layer portion and the second metal layer portion; and a tunnel magnetoresistance (TMR) element positioned on and in electrical contact with the conductive material layer. A first current is configured to flow from the first metal layer portion, through the conductive material layer, to the second metal layer portion, and a second current is configured to flow from the first metal layer portion, through the conductive material layer, through the TMR element, and exiting through a top of the TMR element.

25 Claims, 11 Drawing Sheets

(56) References Cited

U.S. PATENT DOCUMENTS

| | | | |
|---|---|---|---|
| 2006/0034022 A1* | 2/2006 | Fukuzawa | G11B 5/3909 |
| | | | 257/E27.005 |
| 2010/0020592 A1* | 1/2010 | Hosotani | G11C 11/161 |
| | | | 365/158 |
| 2012/0306490 A1 | 12/2012 | Furuichi et al. | |
| 2019/0227130 A1 | 7/2019 | Hong et al. | |
| 2019/0305216 A1 | 10/2019 | Gosavi et al. | |
| 2020/0033424 A1 | 1/2020 | Campiglio et al. | |
| 2020/0066790 A1* | 2/2020 | Lassalle-Balier | |
| | | | G01R 33/0005 |
| 2020/0350120 A1 | 11/2020 | Han et al. | |
| 2021/0065949 A1* | 3/2021 | Campiglio | H10N 50/85 |
| 2021/0193913 A1 | 6/2021 | Ichikawa et al. | |
| 2021/0311139 A1 | 10/2021 | Suess et al. | |
| 2021/0383953 A1 | 12/2021 | Campiglio et al. | |
| 2021/0389393 A1* | 12/2021 | Lassalle-Balier | G01R 33/098 |

OTHER PUBLICATIONS

U.S. Appl. No. 17/648,151, filed Jan. 17, 2022, Klebanov et al.
U.S. Appl. No. 17/648,154, filed Jan. 17, 2022, Liu et al.
U.S. Appl. No. 17/813,412, filed Jul. 19, 2022, Jaiswal et al.

* cited by examiner

MULTI-TERMINAL DEVICES USING MAGNETORESISTANCE ELEMENTS

BACKGROUND

As is known in the art, magnetic field sensing elements can be used in a variety of applications. In one example application, a magnetic field sensing element can be used to detect motion (e.g., rotation) of an object, such as a gear or ring magnet. A magnetic field affected by motion of the object may be detected by one or more magnetic field sensing elements, such as Hall effect elements and/or magnetoresistance (XMR) elements, which provide a signal (i.e., a magnetic field signal) in response to an applied magnetic field. Motion of the object may, for example, result in variations in a distance between a perimeter of the object (or target features of the object) and the magnetic field sensing elements, which may result in variations in the applied magnetic field to which the magnetic field sensing elements are exposed, and in the magnetic field signals provided by the magnetic field sensing elements in response to the applied magnetic field. Such magnetic field signals can be processed to detect position, proximity, speed and/or direction of motion of the object, for example.

Various parameters characterize the performance of magnetic field sensing elements and circuits or sensors that use magnetic field sensing elements. With regard to magnetic field sensing elements, the parameters include sensitivity, which corresponds to a change in a resistance of a magnetoresistance element or a change in an output voltage from a Hall effect element, for example, in response to an applied magnetic field (e.g., a magnetic field as may be affected by motion of a ferromagnetic object). Additionally, with regard to magnetic field sensing elements, the parameters include linearity, which corresponds to a degree to which the resistance of the magnetoresistance element or the output voltage from the Hall effect element varies linearly (i.e., in direct proportion) to the applied magnetic field.

Magnetoresistance elements are known to have a relatively high sensitivity compared, for example, to Hall effect elements. Magnetoresistance elements are also known to have moderately good linearity, but over a restricted or limited range of magnetic fields, more restricted in range than a range over which Hall effect elements can operate. It is known that in the restricted range of magnetic fields (i.e., in a so-called "linear region" or "linear range" of a magnetoresistance element), the resistance of a magnetoresistance element is typically indicative of an applied magnetic field to which the magnetoresistance element is exposed. It is also known that outside the restricted range of magnetic fields (i.e., in so-called "saturation regions"), the resistance of a magnetoresistance element is typically not indicative of the applied magnetic field. As a result of the foregoing, an operational range of a magnetoresistance element (i.e., a range in which the magnetoresistance element has a resistance that is indicative of an applied magnetic field) is typically limited to the restricted range of magnetic fields (i.e., the linear range of the magnetoresistance element). Additionally, an operational range of a circuit or sensor (e.g., a magnetic field sensor) using the magnetoresistance element (i.e., a range in which the circuit or sensor using the magnetoresistance element is capable of generating a signal indicative of the applied magnetic field) may be limited to the operational range of the magnetoresistance element.

For at least the above reasons, the fundamental usage for conventional magnetoresistance elements, and circuits or sensors using conventional magnetoresistance elements, has typically been limited to applications in which sensing is needed over a restricted range of magnetic fields (e.g., low strength magnetic fields) and the relatively high sensitivity characteristics of magnetoresistance elements are desired.

SUMMARY

In an aspect, a sensor includes a first metal layer portion and a second metal layer portion separated by an insulator material, a conductive material layer in electrical contact with the first metal layer portion and the second metal layer portion, and a tunnel magnetoresistance (TMR) element positioned on and in electrical contact with the conductive material layer. A first current is configured to flow from the first metal layer portion, through the conductive material layer, to the second metal layer portion, and a second current is configured to flow from the first metal layer portion, through the conductive material layer, through the TMR element, and exiting through a top of the TMR element.

Implementations can include one or more of the following features.

In some implementations, the first current is configured to flow through a bottom layer of the TMR element.

In some implementations, the bottom layer of the TMR element is a reference layer.

In an aspect, a sensor includes a first metal layer portion, a second metal layer portion, and a third metal layer portion each separated by an insulator material. The sensor also includes a conductive material layer in electrical contact with the first, second, and third metal layer portions, and a tunnel magnetoresistance (TMR) element positioned on and in electrical contact with the conductive layer. A first current is configured to flow from the first metal layer portion, through the conductive material layer, to the third metal layer portion, and a second current is configured to flow from the second metal layer portion, through the conductive material layer, through the TMR element, and exiting through a top of the TMR element.

Implementations can include one or more of the following features.

In some implementations, the conductive material layer includes titanium nitride.

In some implementations, the first current is configured to flow through a bottom layer of the TMR element.

In some implementations, the first current flows through a bottom layer of the TMR element, without passing through a barrier layer of the TMR element, and causes the bottom layer to increase in temperature beyond a blocking temperature of the TMR element such that current-induced degradation of the barrier layer does not occur.

In some implementations, the first current is controlled to cause a bottom layer of the TMR element to remain at a constant temperature.

In some implementations, the sensor includes a thermal diode configured to monitor a temperature of a bottom layer of the TMR element.

In some implementations, the bottom layer of the TMR element is a reference layer.

In some implementations, the first current causes a planar magnetic field to be generated in the TMR element in a direction that is perpendicular to a direction of flow of the first current.

In some implementations, the first current includes a modulation signal configured to modify a magnetic field signal received by the TMR element, and the sensor is configured to demodulate the modified signal to determine the magnetic field signal.

In some implementations, the conductive material layer is a heavy metal layer that is configured to generate a transversal spin current in the TMR element in response to the first current.

In some implementations, the transversal spin current causes a resistance associated with the TMR element to change.

In some implementations, the sensor is configured to measure the first current based on a change in the resistance associated with the TMR element caused by the transversal spin current.

In some implementations, the change in the resistance is based on a relative orientation between a magnetization of a free layer of the TMR element and a magnetization of a reference layer of the TMR element.

In some implementations, the heavy metal layer includes one or more of platinum, tantalum, tungsten, and gold.

In some implementations, the TMR element includes a free layer positioned on the heavy metal layer, a barrier layer positioned on the free layer, and a reference layer positioned on the barrier layer.

In some implementations, the barrier layer includes magnesium oxide (MgO).

In some implementations, the TMR element includes a seed layer positioned beneath the heavy metal layer and a capping layer positioned on the reference layer.

In some implementations, the conductive material layer includes one or more coils.

In an aspect, a tunnel magnetoresistance (TMR) element includes a heavy metal layer, a free layer positioned on the heavy metal layer, a barrier layer positioned on the free layer, and a reference layer positioned on the barrier layer. The heavy metal layer is configured to generate a transversal spin current in the TMR element in response to a current flowing through the heavy metal layer.

Implementations can include one or more of the following features.

In some implementations, the TMR element includes a seed layer positioned beneath the heavy metal layer, and a capping layer positioned on the reference layer.

In some implementations, the barrier layer includes magnesium oxide (MgO).

In some implementations, the transversal spin current is proportional to the current flowing through the heavy metal layer, and the transversal spin current causes a resistance of the TMR element to change.

In some implementations, the change of resistance is indicative of a value of the current flowing through the heavy metal layer.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAIL DESCRIPTION

Described herein are multi-terminal devices using magnetoresistance (XMR) elements, such as tunnel magnetoresistance elements (TMR) and giant magnetoresistance elements (GMR), as well as integration schemes, applications, and measurements related to same. XMR elements having multi-terminal integration schemes are described, along with various applications that can be made possible by such integration schemes. Further, techniques that utilize spin-orbit torques in the XMR to make direct current measurements are also described herein.

Figure 1:
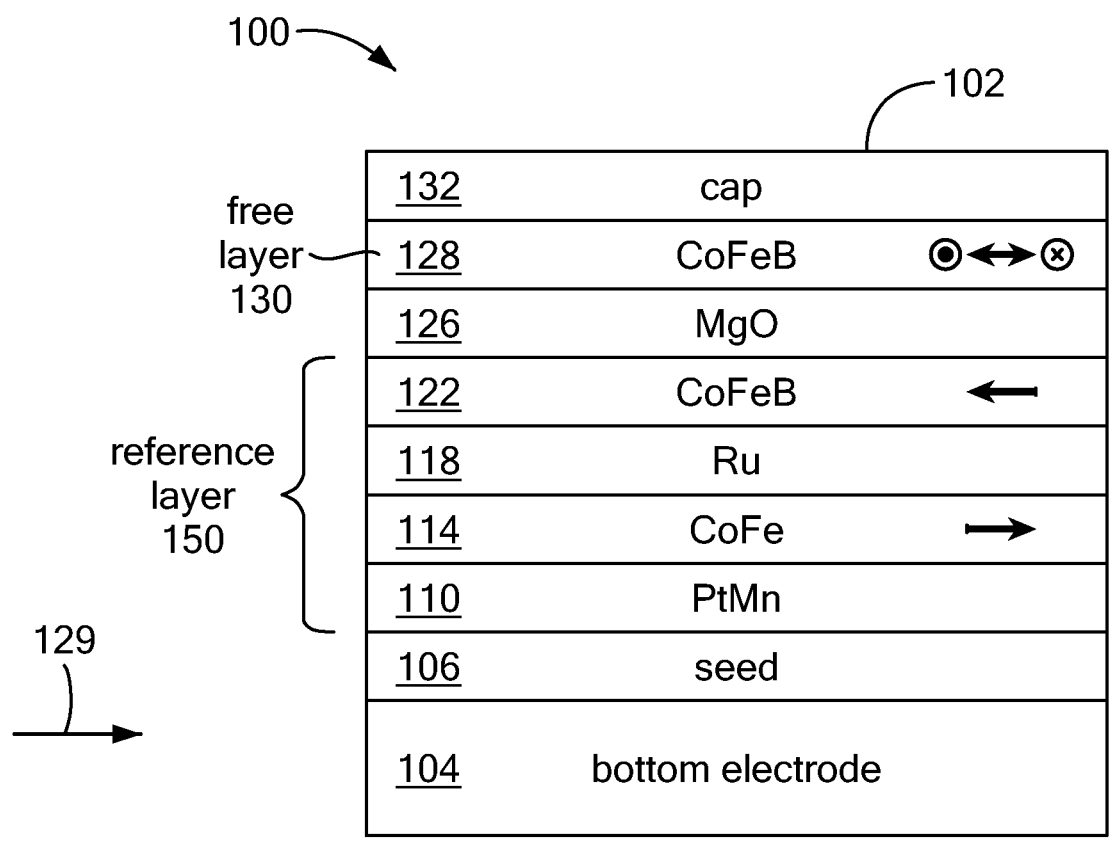
FIG. 1 is a block diagram of an illustrative prior art tunneling magnetoresistance (TMR) element.

Referring to FIG. 1, an illustrative TMR element 100 can have a stack 102 of layers 106, 110, 114, 118, 122, 126, 128, 132 indicative of one pillar of a multi-pillar TMR element. Generally, the layer 106 is a seed layer (e.g., a copper nickel (CuN) layer) with the layer 110 located on the seed layer 106. The layer 110 includes platinum manganese (PtMn) or iridium manganese (IrMn), for example. The layer 114 is located on the layer 110 and the layer 118 is located on the layer 114. In one example, the layer 114 includes cobalt iron (CoFe) and the layer 118 is a spacer layer and includes ruthenium (Ru). On the layer 118, a magnesium oxide (MgO) layer 126 (sometimes called a "barrier layer") is sandwiched between two cobalt iron boron (CoFeB) layers 122, 128. A cap layer 132 (e.g., tantalum (Ta)) is located on the CoFeB layer 128. The layer 114 is a single layer pinned layer that is magnetically coupled to the layer 110. The physical mechanism that is coupling layers 110 and 114 together is sometimes called an exchange bias.

A free layer 130 includes the CoFeB layer 128. In some examples, the free layer 130 may include an additional layer of nickel iron (NiFe) (not shown) and a thin layer of tantalum (not shown) between the CoFeB layer 128 and the NiFe layer.

It will be understood that a driving current running through the TMR element 100 runs through the layers of the stack, running between seed and cap layers 106 and 132, i.e., perpendicular to a surface of a bottom electrode 104. The TMR element 100 can have a maximum response axis that is parallel to the surface of the bottom electrode 104 and that is in a direction 129, and also parallel to the magnetization direction of a reference layer 150, comprised of layers 110, 114, 118, and 122, most notably in the layer CoFeB 122.

The TMR element 100 has a maximum response axis (maximum response to external fields) aligned with the arrow 129, i.e., perpendicular to bias directions experienced by the free layer 130, and parallel to magnetic fields of the reference layer 150, notably pinned layer 122. Also, in general, it is rotations of the magnetic direction of the free layer 130 caused by external magnetic fields that result in changes of resistance of the TMR element 100, which may be due to a change in angle or a change in amplitude if an external bias is present because the sum vector of the external field and the bias is causing a change in the angle between the reference layer 150 and the free layer 130.

Figure 2:
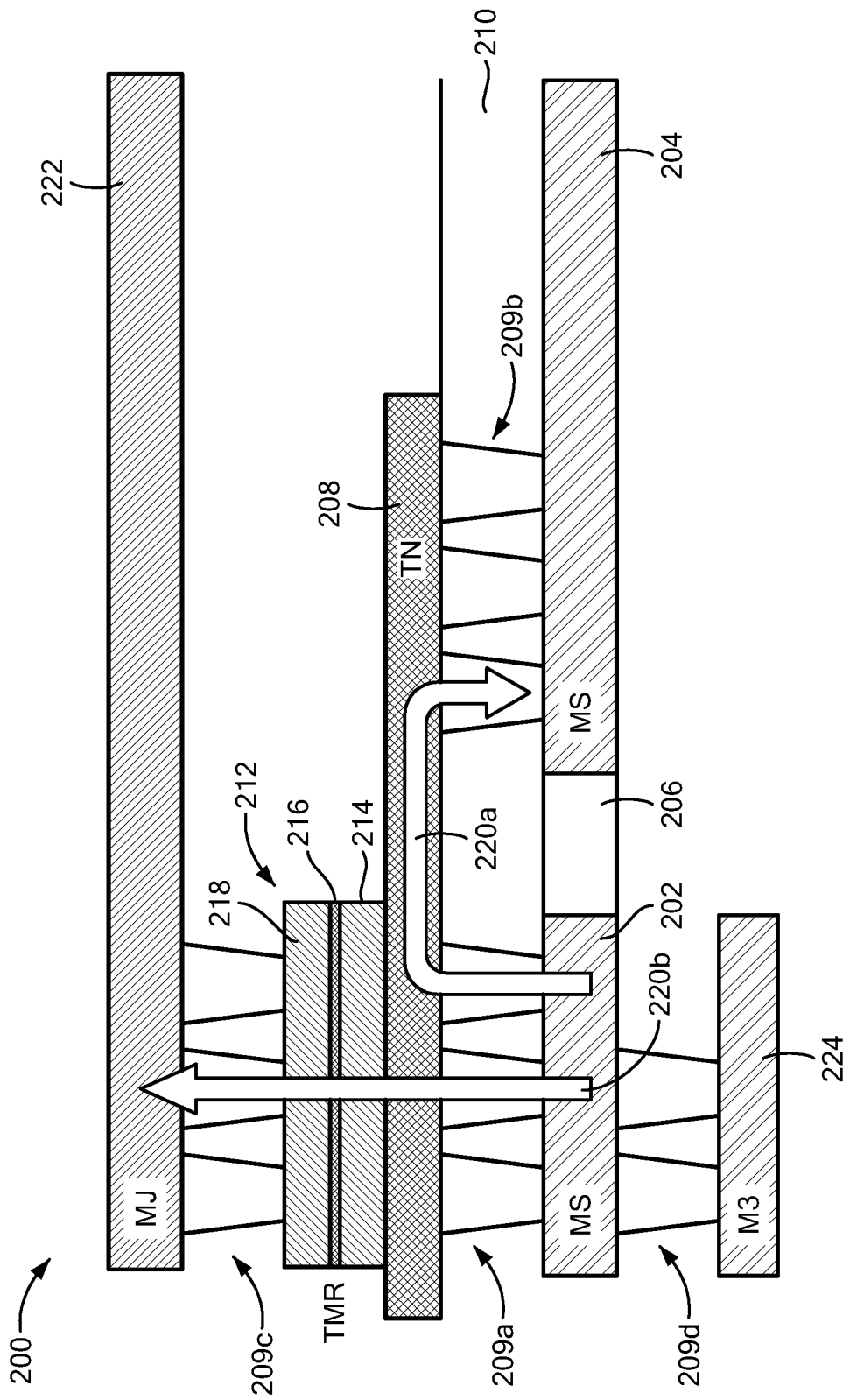
FIG. 2 is a block diagram of an illustrative three-terminal device.

Referring to FIG. 2, an example multi-terminal (e.g., three-terminal) device 200 is illustrated. The device 200 may be or may be part of a magnetic sensor that can include one or more MR elements. The device 200 includes a first metal layer portion 202 and a second metal layer portion 204 separated by an insulator material 206. The device 200 also includes a conductive material layer 208 in electrical contact with the first metal layer portion 202 and the second metal layer portion 204 through vias 209a and 209b, respectively. The conductive material layer 208 can include one or more coils. In some implementations, the conductive material layer 208 includes titanium nitride (TiN). In some implementations, the conductive material layer 208 is a heavy metal layer that can include one or more of platinum, tantalum, tungsten, and gold, as described in more detail below. An insulator layer 210 separates the conductive material layer 208 from the first metal layer portion 202 and the second metal layer portion 204.

The device 200 includes a magnetoresistance (MR) element, in this example, a tunnel magnetoresistance (TMR) element 212, positioned on an in electrical contact with the conductive material layer 208. In particular, in this example, there is electrical contact between the TMR element 212 and a "gap-less" conductive material layer 208.

In some implementations, the TMR element 212 can include a free layer 214 positioned on the conductive material layer 208, a barrier layer 216 positioned on the free layer 214, and a reference layer 218 positioned on the barrier layer 216. In some implementations, an inverted TMR structure can be employed by the TMR element 212. In some implementations, the TMR element 212 includes a seed layer (not shown in this example) positioned beneath the conductive material layer 208 and a capping layer (not shown in this example) positioned on the reference layer 218. More details with respect to possible TMR structures are described herein with respect to FIGS. 10A and 10B. In one example, the barrier layer 216 may include magnesium oxide (MgO).

A first current 220a is configured to flow from the first metal layer portion 202, through the conductive material layer 208, to the second metal layer portion 204. In some implementations, the first current 220a is also configured to flow through a bottom layer (in this example, the free layer 214) of the TMR element 212 (e.g., without passing through the barrier layer 216 of the TMR element 212). The bottom layer of the TMR element 212 can be the reference layer 218 or the free layer 214, depending on the particular TMR structure employed for the application. A second current 220b is configured to flow from the first metal layer portion 202, through the conductive material 208, through the TMR element 212, and exiting through a top of the TMR element 212 (e.g., to a metal layer 222). The device 200 also includes another metal layer 224, with the second metal layer portion 204, the metal layer 222, and the metal layer 224 forming the three contacts of the device 200. The metal layer 222 is in electrical contact with the TMR element 212 through vias 209c, and the metal layer 224 is in electrical contact with the first metal layer portion 202 through vias 209d.

While the first current 220a and the second current 220b are described, it should be understood that other currents may also be present instead of or in addition to the first current 220a and the second current 220b depending on the particular application and/or operating mode of the device 200. Similarly, one or both of the first current 220a and the second current 220b may be present depending on the particular application and/or operating mode of the device 200.

Figure 3:
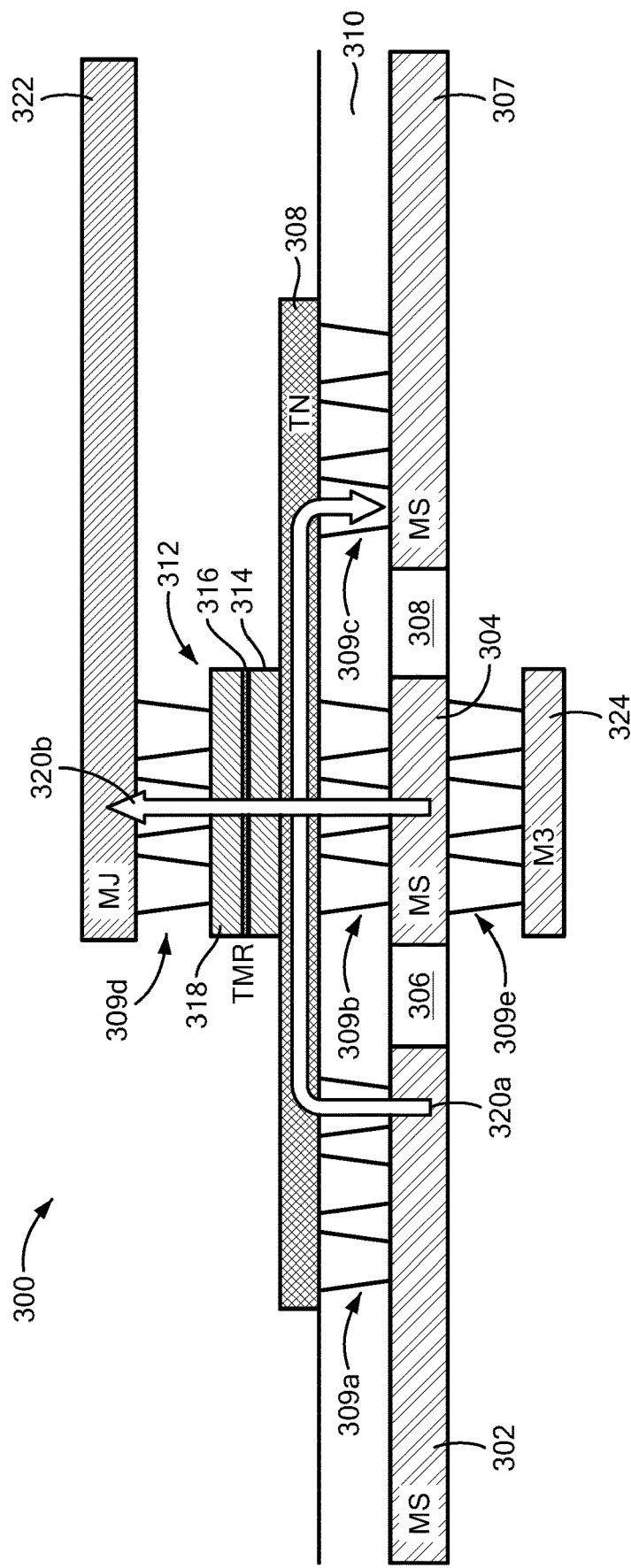
FIG. 3 is a block diagram of an illustrative four-terminal device.

Devices can include additional or fewer contacts than that shown in FIG. 2. In some implementations, a device can include a fourth contact. Referring to FIG. 3, an example multi-terminal (e.g., four-terminal) device 300 is illustrated. The device 300 may be or may be part of a magnetic sensor that can include one or more MR elements. The device 300 includes a first metal layer portion 302, a second metal layer portion 304, and a third metal layer portion 307 each separated by an insulator material 306. The device 300 also includes a conductive material layer 308 in electrical contact with the first, second, and third metal layer portions 302, 304, 307 through vias 309a, 309b, and 309c, respectively. The conductive material layer 308 can include one or more coils. In some implementations, the conductive material layer 308 includes titanium nitride (TiN). In some implementations, the conductive material layer 308 is a heavy metal layer. An insulator layer 310 separates the conductive material layer 308 from the first, second, and third metal layer portions 302, 304, 307.

The device 300 includes a magnetoresistance (MR) element, in this example, a tunnel magnetoresistance (TMR) element 312, positioned on an in electrical contact with the conductive material layer 308. In particular, in this example, there is electrical contact between the TMR element 312 and a "gap-less" conductive material layer 308.

In some implementations, the TMR element 312 can include a free layer 314 positioned on the conductive material layer 308, a barrier layer 316 positioned on the free layer 314, and a reference layer 318 positioned on the barrier layer 316. In some implementations, an inverted TMR structure can be employed by the TMR element 312. In some implementations, the TMR element 312 may include a seed layer (not shown in this example) positioned beneath the conductive material layer 308, and may include a capping layer (not shown in this example) positioned on the reference layer 318.

A first current 320a is configured to flow from the first metal layer portion 302, through the conductive material 308, to the third metal layer portion 307. In some implementations, the first current 320a is also configured to flow through a bottom layer (in this example, the free layer 314) of the TMR element 312 (e.g., without passing through the barrier layer 316 of the TMR element 312). The bottom layer of the TMR element 312 can be a reference layer or a free layer, depending on the particular TMR structure employed for the application. A second current 320b is configured to flow from the second metal layer portion 304, through the conductive material layer 308, through the TMR element 312, and exiting through a top of the TMR element 312 (e.g., to a metal layer 322). The device 300 also includes another metal layer 324, with the first metal layer portion 302, the third metal layer portion 307, the metal layer 322, and the metal layer 324 forming the four contacts of the device 300. The metal layer 322 is in electrical contact with the TMR element 312 through vias 309d, and the metal layer 324 is in electrical contact with the second metal layer portion 304 through vias 309e. In one example, the barrier layer 316 may include magnesium oxide (MgO).

Figure 4A:
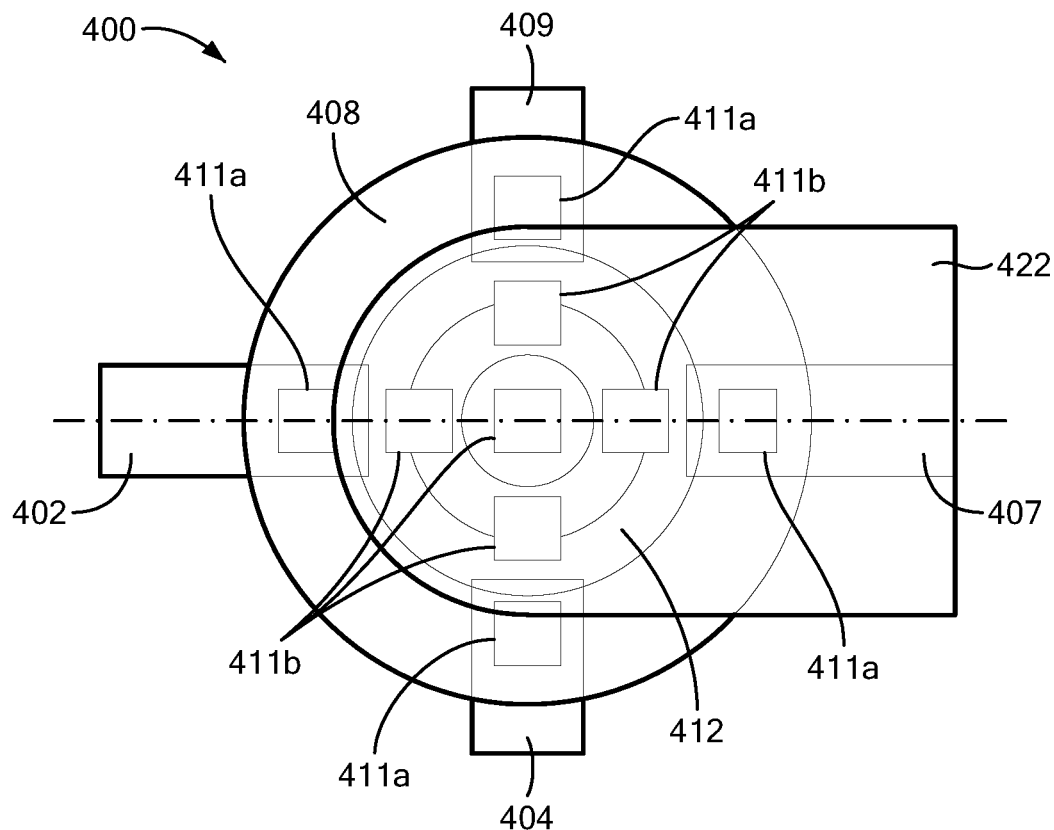
FIG. 4A is a top view and FIG. 4B is a cross-sectional view of a block diagram of an illustrative three-terminal device.
Figure 4B:
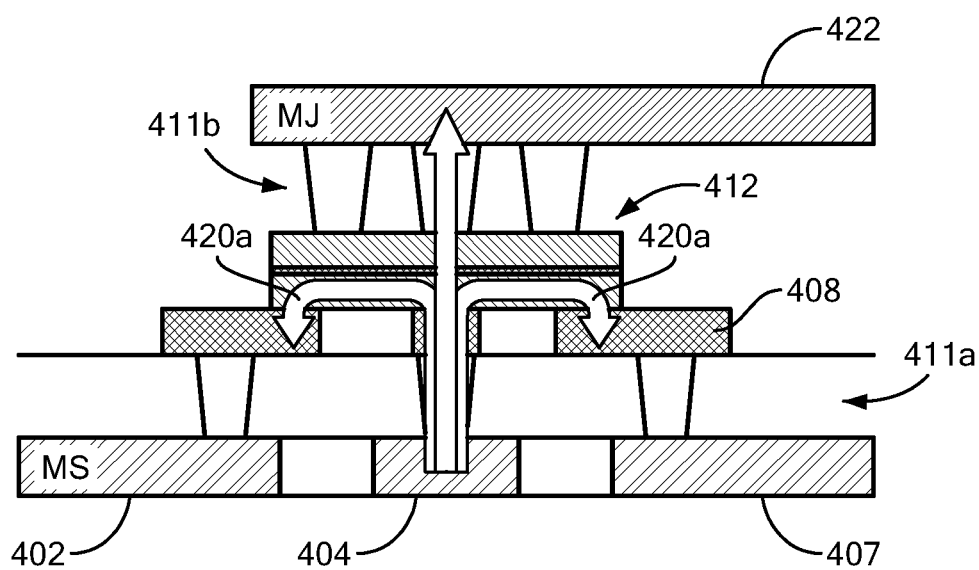

FIG. 4A is a top view and FIG. 4B is a cross-sectional view of an example multi-terminal (e.g., three-terminal)

device 400. In this example, a conductive material layer 408, a TMR element 412, a metal layer including first, second, third, and fourth portions 402, 404, 407, 409, and a metal layer 422 are arranged in circular patterns/arrangements. Such patterns/arrangements can assist in allowing first currents 420a to uniformly flow through a bottom layer of the TMR element 412. In this example, the conductive material layer 408 is separated into three portions. The metal layer including first, second, third, and fourth portions 402, 404, 407, 409 is in electrical contact with the conductive material layer 408 through vias 411a, and the metal layer 422 is in electrical contact with the TMR element 412 through vias 411b.

Figure 5A:
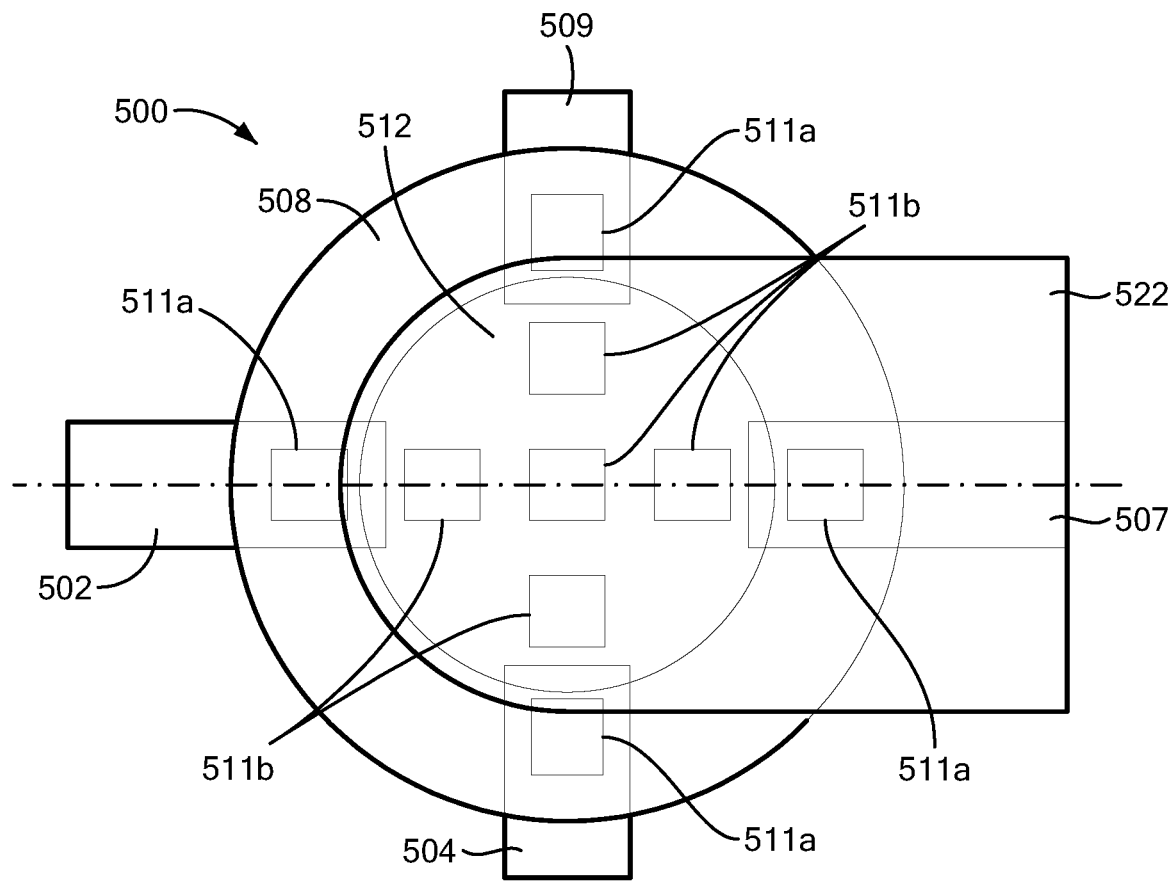
FIG. 5A is a top view and FIG. 5B is a cross-sectional view of a block diagram of an illustrative three-terminal device.
Figure 5B:
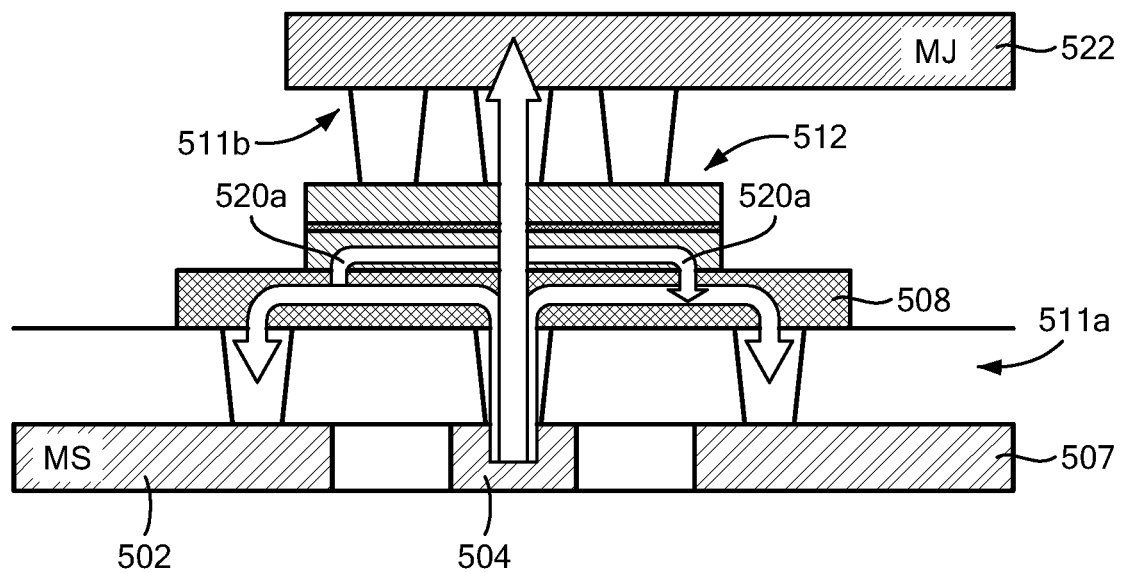

FIG. 5A is a top view and FIG. 5B is a cross-sectional view of an example multi-terminal (e.g., three-terminal) device 500. In this example, a conductive material layer 508, a TMR element 512, a metal layer including first, second, third, and fourth portions 502, 504, 507, 509, and a metal layer 522 are arranged in circular patterns/arrangements. Such patterns/arrangements can assist in allowing first currents 520a to uniformly flow through a bottom layer of the TMR element 512. In this example, the conductive material layer 508 is formed as a single portion. The metal layer including first, second, third, and fourth portions 502, 504, 507, 509 is in electrical contact with the conductive material layer 508 through vias 511a, and the metal layer 522 is in electrical contact with the TMR element 512 through vias 511b.

The devices described herein may be used for various applications, as will be described. The particular characteristics and properties employed for the devices and the MR element may depend on the particular application.

Figure 6:
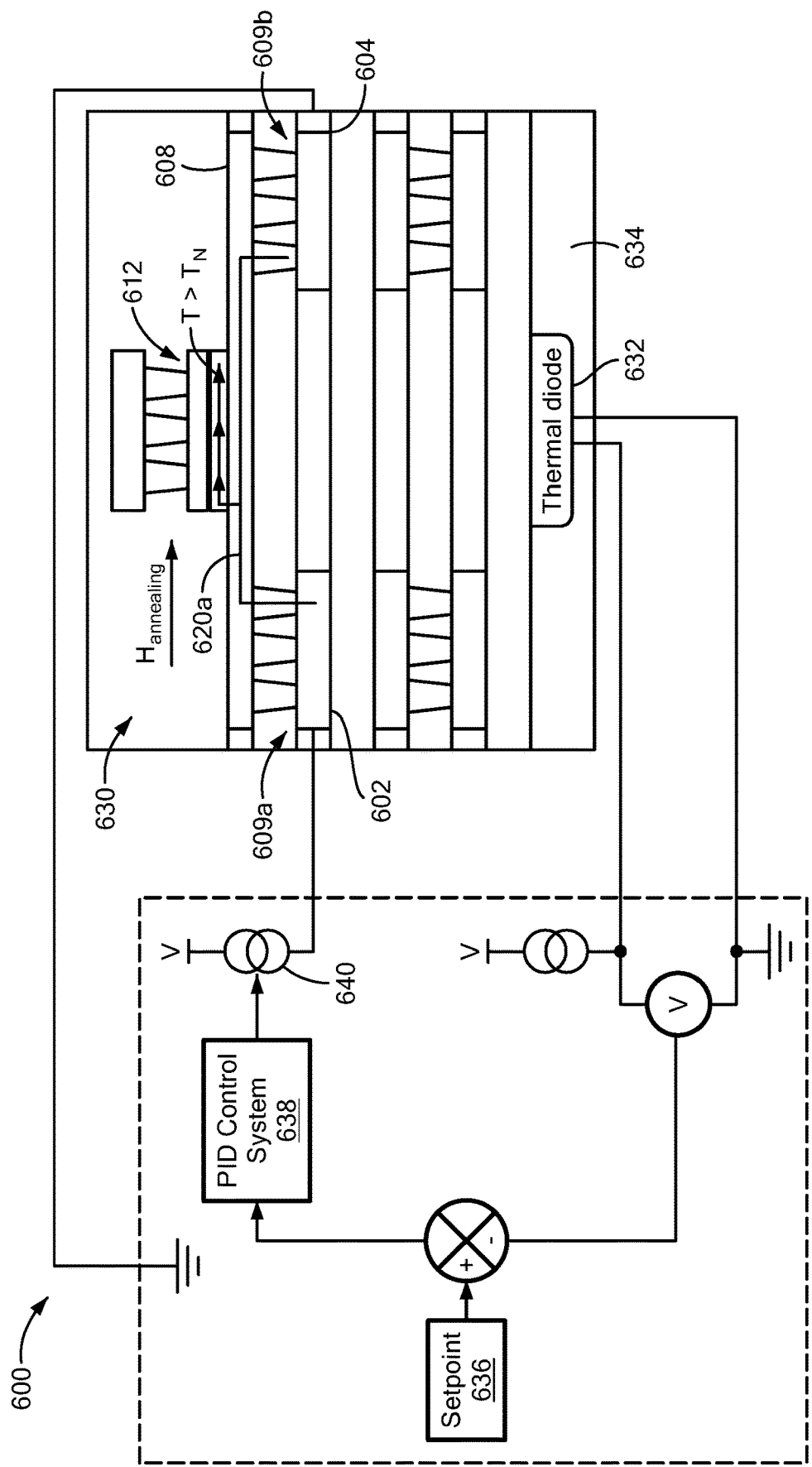
FIG. 6 is a block diagram of a system that includes a four-terminal device undergoing an annealing procedure.

FIG. 6 shows a system 600 that includes an example multi-terminal (e.g., four-terminal) device 630 undergoing an annealing procedure. In this example, a TMR element 612 is being heated for TMR initialization. A current 620a (e.g., which may be or be similar to the first current 220a, 320a described with respect to FIGS. 2 and 3) can be used to heat up a bottom layer of the TMR element 612. In some implementations, a platinum (Pt) wire or a silicon carbide (SiC) element can provide the current 620a that heats the bottom layer of the TMR element 612. The current 620a can flow from a first metal layer portion 602, through vias 609a, through a conductive material layer 608, through a bottom layer of the TMR element 612 without passing through a barrier layer of the TMR element 612, through vias 609b, and to a second metal layer portion 604. In some implementations, the bottom layer is a reference layer of the TMR element 612, although other configurations are possible. The TMR element 612 is heated to a temperature above a blocking temperature or a Néel temperature ($T_N$) of the antiferromagnet material of the bottom layer of the TMR element 612, allowing a reference magnetization direction to be established in the reference layer when a magnetic field is applied when the blocking temperature has been exceeded. Reaching the Néel temperature causes the domains of the antiferromagnetic material to become disoriented. The Néel temperature is material dependent. The current 620a is applied without passing through a barrier layer of the TMR element 612, thus avoiding possible current-induced degradation of the barrier layer. In some implementations, the heating also causes crystallization of the barrier layer. In some implementations, the reference magnetization direction can be established in a direction parallel to a surface plane of the TMR element 612 in a manner similar to the TMR element 100 illustrated in FIG. 1. The reference magnetization direction in the reference layer can be established by applying an external field or by using an Oersted field generated by the current 620a passing through the conductive material layer 608 on which the TMR element 612 is positioned, as described in more detail below, thereby aligning the reference layer.

The system 600 includes a thermal diode 632 positioned on a substrate 634 that is configured to measure a temperature of the bottom layer of the TMR element 612 and control the current 620a to cause the current 620a to heat the bottom layer of the TMR element 612 to the appropriate temperature (e.g., the blocking or Néel temperature). A temperature setpoint 636 (e.g., based on the blocking or Néel temperature) can be applied, and a control system 638 is used to control a voltage-controlled current source 640 to cause the current 620a to run through the bottom layer of the TMR element 612. The thermal diode 632 can monitor the temperature of the bottom layer of the TMR element 612 that results from the current 620a being applied and provide a signal to the control system 638 which causes the control system 638 to adjust the applied current 620a if necessary. In this way, a loop is formed to ensure that an appropriate temperature is reached in the bottom layer of the TMR element 612.

In some implementations, the bottom layer of the TMR element 612 can be maintained at a constant temperature by controlling the current 620a running through the bottom layer of the TMR element 612. Such thermal stabilization can be used to reduce or prevent temperature-related drifts from occurring. In some implementations, the system 600 can be used to control the thermal diode 632, which can be used to monitor the temperature of the bottom layer of the TMR element 612 such that it can be maintained at a desired temperature setpoint.

Figure 7:
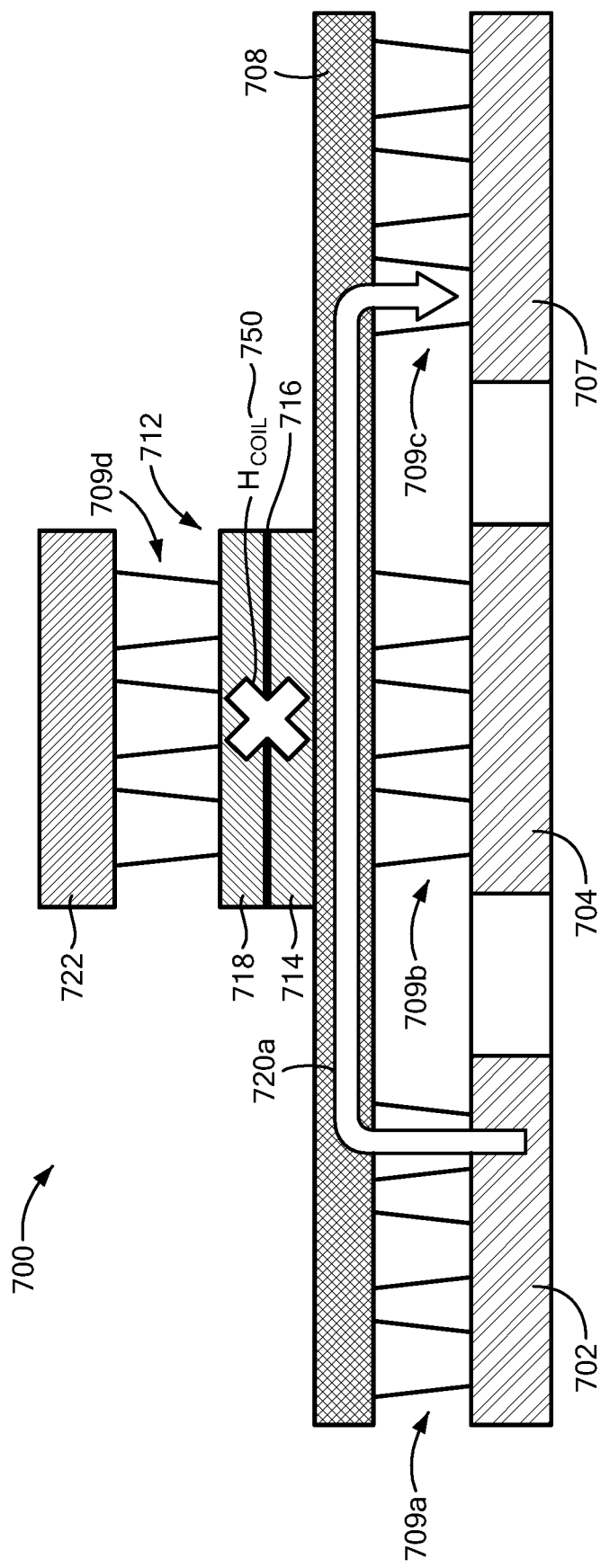
FIG. 7 is a block diagram of an illustrative device in which an Oersted field $H_{COIL}$ is formed in a TMR element.

FIG. 7 shows an exemplary device 700 in which an Oersted field $H_{COIL}$ 750 is formed in a TMR element 712. The device 700 includes a first metal layer portion 702, a second metal layer portion 704, and a third metal layer portion 707 in electrical contact with a conductive material layer 708 through vias 709a, 709b, and 709c, respectively. The TMR element 712 is positioned on an in electrical contact with the conductive material layer 708. In particular, in this example, there is electrical contact between the TMR element 712 and a "gap-less" conductive material layer 708. The device 700 also includes a metal layer 722 in electrical contact with the TMR element 712 through vias 709d.

In some implementations, the TMR element 712 can include a free layer 714 positioned on the conductive material layer 708, a barrier layer 716 positioned on the free layer 714, and a reference layer 718 positioned on the barrier layer 716. In some implementations, an inverted TMR structure can be employed by the TMR element 712 such that a reference layer is positioned on a conductive material layer, a barrier layer is positioned on the reference layer, and a free layer is positioned on the barrier layer. In some implementations, the TMR element 712 includes a seed layer (not shown in this example) positioned beneath the conductive material layer 708 and a capping layer (not shown in this example) positioned on the reference layer 718. More details with respect to possible TMR structures are described herein with respect to FIGS. 10A and 10B.

A current 720a is configured to flow from the first metal layer portion 702, through the conductive material layer 708, to the third metal layer portion 707. In some implementations, the current 720a is also configured to flow through a bottom layer (in this example, the free layer 714) of the TMR element 712 (e.g., without passing through the barrier layer 716 of the TMR element 712). The bottom layer of the TMR element 712 can be the reference layer 718 or the free layer 714, depending on the particular TMR structure employed for the application. While the current 720a is described, it should be understood that other currents may also be present instead of or in addition to the current 720a depending on the particular application and/or operating mode of the device 700.

In some implementations, the proximity of the line of current 720a and the TMR element 712 can improve a coupling ratio with respect to the same current density used in other metal layers of the device 700. The Oersted field $H_{COIL}$ 750 formed by the TMR element 700 can be planar at least in part due to one or more properties of the conductive material layer 708 (e.g., such as being a single continuous conductive material layer 708). The planar Oersted field $H_{COIL}$ 750 can be generated in a direction that is perpendicular to a direction of flow of the current 720a.

Figure 8:
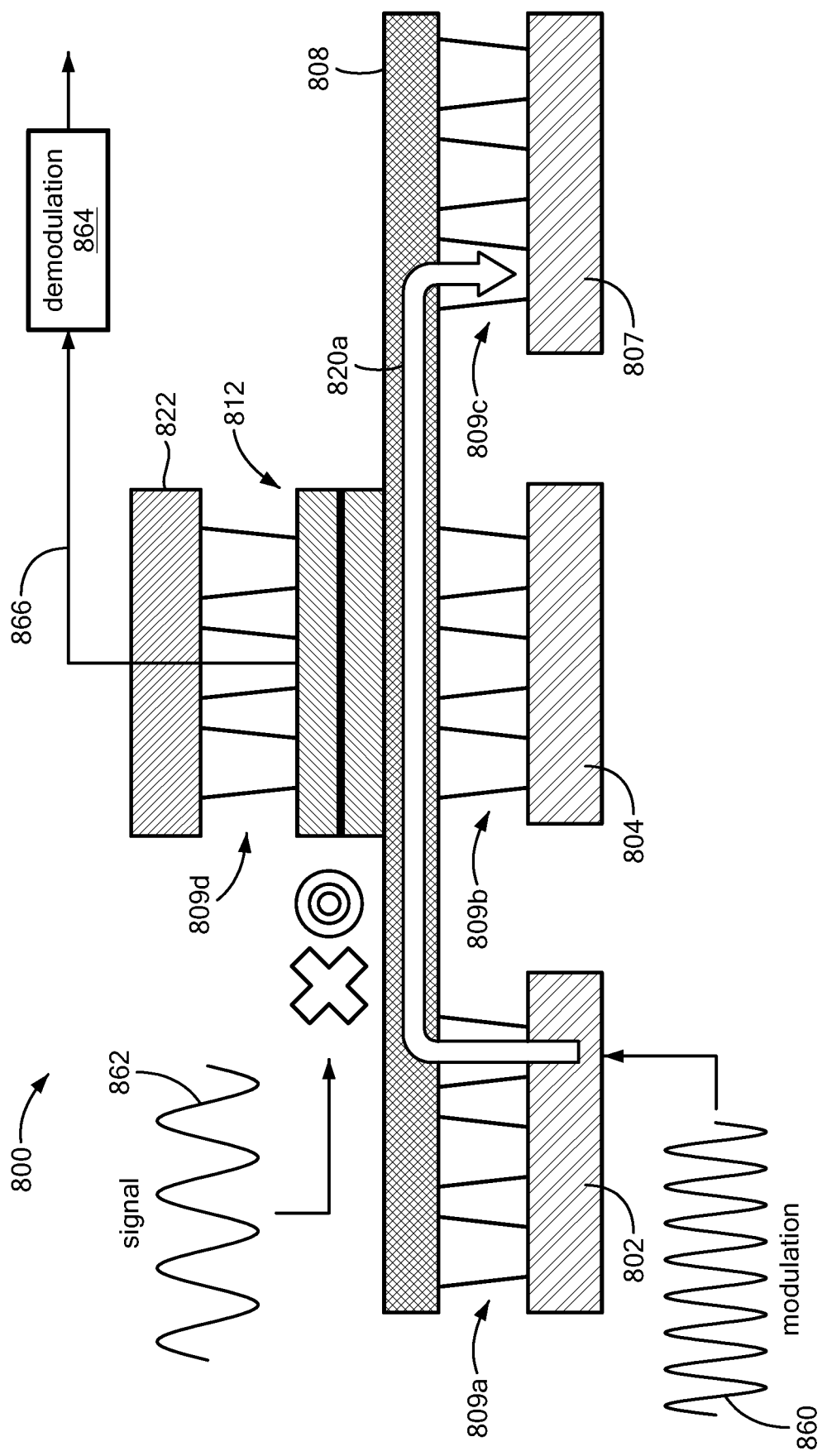
FIG. 8 is a block diagram of an illustrative device in which a current includes a modulation signal.

FIG. 8 shows an exemplary device 800 in which a current 820a (e.g., which may be or may be similar to at least the first current 220a, 320a described with respect to FIGS. 2 and 3) includes a modulation signal 860. The device 800 includes a first metal layer portion 802, a second metal layer portion 804, and a third metal layer portion 807 in electrical contact with a conductive material layer 808 through vias 809a, 809b, and 809c, respectively. The device 800 also includes a metal layer 822 in electrical contact with a TMR element 812 through vias 809d.

The modulation signal 860 is configured to modify a magnetic field signal 862 received by the TMR element 812. The magnetic field signal 862 can be received in a direction perpendicular to the flow of the current 820a. The device 800 is configured to demodulate 864 the modified signal 866 to determine the magnetic field signal 862, which can be indicative of a property of a magnetic field being sensed by the device 800 or can be used to verify that the TMR element 812 is operating correctly. In some implementations, the TMR element 812 may have a configuration with one or more similarities to the configuration of the TMR element 1000b of FIG. 10B (e.g., with the magnetic field of the free layer being in the same plane as the current running through the conductive material layer).

Traditionally, concepts used by current sensors involve utilizing a concept that a current carrying conductor (e.g., a conductive material layer) generates a magnetic field known as an Oersted field. Such current sensors worked by measuring this Oersted field and indirectly measuring what the current required to generate such an Oersted field would need to be. The generated Oersted field is sensed as a stray field by a TMR element of the device, and this stray field interacts with a free layer of the TMR element. This causes a change in resistance in the TMR element, which is used to relatively calculate the current being measuring (e.g., the current flowing through the conductive material layer). Disclosed with respect to FIG. 9 is a more direct technique for measuring currents using spin-orbit torques.

Figure 9:
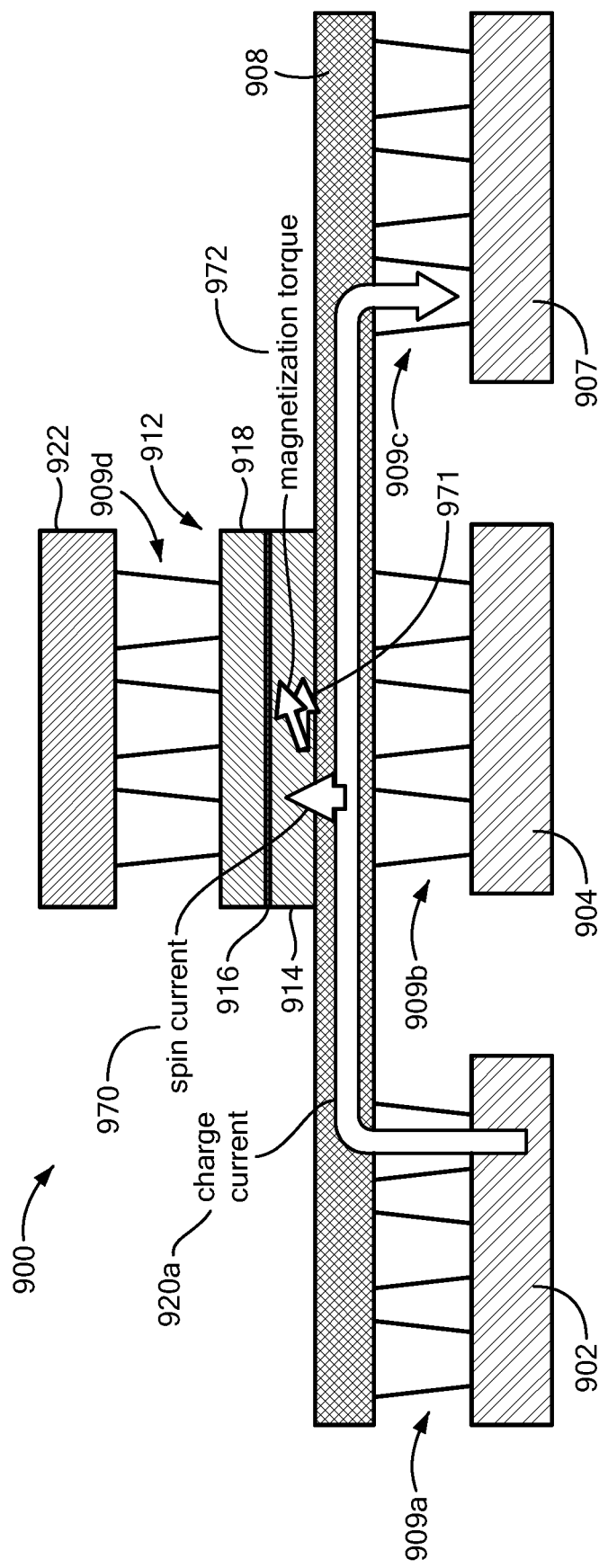
FIG. 9 is a block diagram of an illustrative device in which a current is used to generate a transversal spin current in a TMR element.

FIG. 9 shows an exemplary device 900 in which a current 920a (e.g., which may be or may be similar to at least the first current 220a, 320a described with respect to FIGS. 2 and 3) is used to generate a transversal spin current 970 in a TMR element 912 that includes a free layer 914, a barrier layer 916, and a reference layer 918. The device 900 includes a first metal layer portion 902, a second metal layer portion 904, and a third metal layer portion 907 in electrical contact with a heavy metal layer 908 through vias 909a, 909b, and 909c, respectively. The device 900 also includes a metal layer 922 in electrical contact with the TMR element 912 through vias 909d.

The transversal spin current 970 results due to a relatively large spin-orbit coupling present in a heavy metal layer 908. The spin-orbit coupling strength of a particular element is dependent on the element's atomic number Z. In some implementations, elements having an atomic number of about Z>39 may be considered to have a relatively large spin-orbit coupling.

In this example, the TMR element 912 has an inverted stack arrangement. As a result of the transversal spin current 970, a magnetization torque 972 can be generated on a magnetization 971 in a bottom layer of the TMR element 912 (in this example, the free layer 914). In this example, a conductive material layer is the heavy metal layer 908 and can include one or more of platinum, tantalum, tungsten, and gold, among others. The heavy metal layer 908 can be a paramagnetic material with a relatively large spin-orbit coupling. In some implementations, the free layer 914 can be a single layer or a composite (e.g., multiple) layer.

A spin-Hall angle θ can be defined as a ratio of the spin current 970 to the current 920a. Such a ratio is a material property (e.g., based on the material of the heavy metal layer 908) that directly relates to the current 920a and the spin current 970. Therefore, for a given material, a change in the current 920a relates directly to a change in the spin current 970, and in turn, the degree of the magnetization torque 972 exerted on the magnetization in the free layer 914.

The transversal spin current 970 generated in the TMR element 912 causes a resistance associated with the TMR element 912 to change. In particular, a relative orientation between the magnetization of the free layer 914 (e.g., as indicated by the direction of the magnetization torque 972) and a magnetization of the reference layer 918 (which is not shown in this example, but an example of which can be seen in FIG. 10) can be measured as a resistance change in the TMR element 912. The device 900 is configured to measure the current 920a based on the change in the resistance associated with the TMR element 912. Therefore, by measuring the change in resistance associated with the TMR element 912 on application of the current 920a, one can directly measure the current 920a.

In some implementations, the heavy metal layer 908 is grown using a process that utilizes a particular crystallographic structure that ensures accuracy across all devices that use such a grown heavy metal layer 908.

Figure 10A:
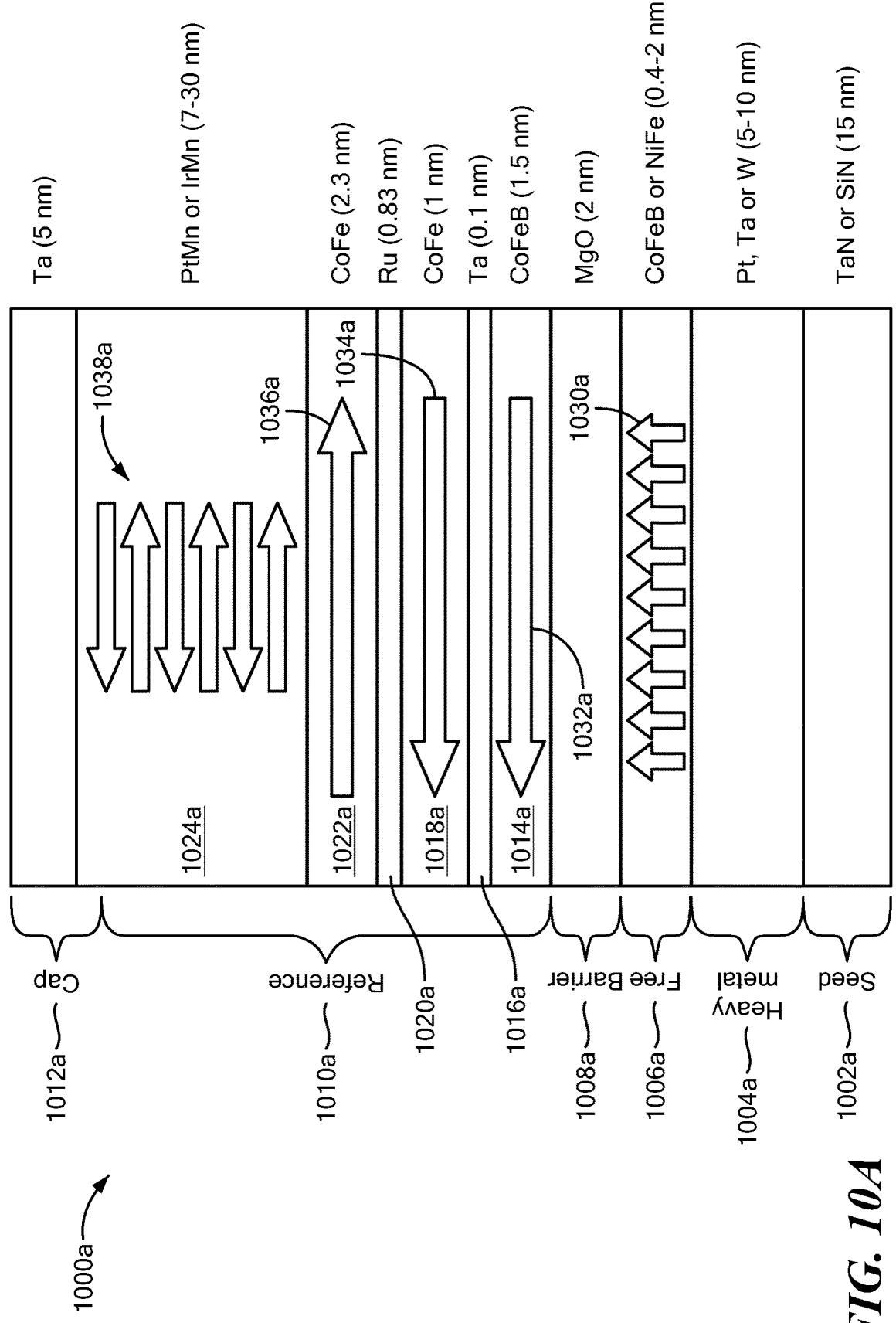
FIGS. 10A and 10B are block diagrams of illustrative TMR elements.

In some implementations, the TMR element 912 may be similar to the TMR element 1000b of FIG. 10A (e.g., by including a heavy metal line and based on the magnetization directions employed in the various layers). In some implementations, the various layers of the device 900 may include one or more of the materials and have one or more of the thicknesses described herein with respect to FIG. 10A.

FIG. 10A shows an example of an illustrative TMR element 1000a that includes a heavy metal layer 1004a. In some implementations, the TMR element 1000a can be an example of the TMR element 912 of FIG. 9. The TMR element 1000a can have a stack of layers indicative of one pillar of a multi-pillar TMR element. The TMR element 1000a can include a seed layer 1002a (e.g., a tantalum nitride (TaN) or silicon nitride (SiN) layer), the heavy metal layer 1004a (e.g., a platinum (Pt), Tantalum (Ta), or Tungsten (W) layer), a free layer 1006a (e.g., a CoFeB or nickel iron (NiFe) layer), a barrier layer 1008a (e.g., a magnesium oxide (MgO) layer), a reference layer 1010a that can include a layer 1014a (e.g., a CoFeB layer), a layer 1016a (e.g., a Tantalum (Ta) layer), a layer 1018a (e.g., a CoFe layer), a layer 1020a (e.g., a ruthenium (Ru) layer), a layer 1022a (e.g., a CoFe layer), and a layer 1024a (e.g., a PtMn or iridium manganese (IrMn) layer), and a cap layer 1012a. In some implementations, the seed layer 1002a is about 15 nm in thickness, the heavy metal layer 1004a is about 5-10 nm in thickness, the free layer 1006a is about 0.4-2 nm in thickness, the barrier layer 1008a is about 2 nm in thickness, the layer 1014a is about 1.5 nm in thickness, the layer 1016a is about 0.1 nm in thickness, the layer 1018a is about 1 nm in thickness, the layer 1020a is about 0.83 nm in thickness, the layer 1022a is about 2.3 nm in thickness, the layer 1024a is about 7-30 nm in thickness, and the cap layer 1012a is about 5 nm in thickness, although other thicknesses are also possible.

In this example, the heavy metal layer 1004a is located on the seed layer 1002a, the free layer 1006a is located on the heavy metal layer 1004a, the barrier layer 1008a is located on the free layer 1006a, the reference layer 1010a is located on the barrier layer 1008a, and the cap layer 1012a is located on the reference layer 1010a Depending on the application, in some implementations, the free layer 1006a and the reference layer 1010a may be in each other's position.

The layers have various magnetization directions associated with them, as illustrated by the arrows. The free layer 1006a can have a magnetization 1030a that is upwards and perpendicular to a top surface of the free layer 1006a and a direction of current flowing through the heavy metal layer 1004a. The layer 1014a can have a magnetization 1032a that is leftwards and parallel to a top surface of the layer 1014a and the direction of current flowing through the heavy metal layer 1004a. The layer 1018a can have a magnetization 1034a that is leftwards and parallel to a top surface of the layer 1018a and the direction of current flowing through the heavy metal layer 1004a. The layer 1022a can have a magnetization 1036a that is rightwards and parallel to a top surface of the layer 1022a and the direction of current flowing through the heavy metal layer 1004a. The layer 1024a can have multiple magnetizations 1038a that are leftwards and rightwards and parallel to a top surface of the layer 1024a and the direction of current flowing through the heavy metal layer 1004a.

Figure 10B:
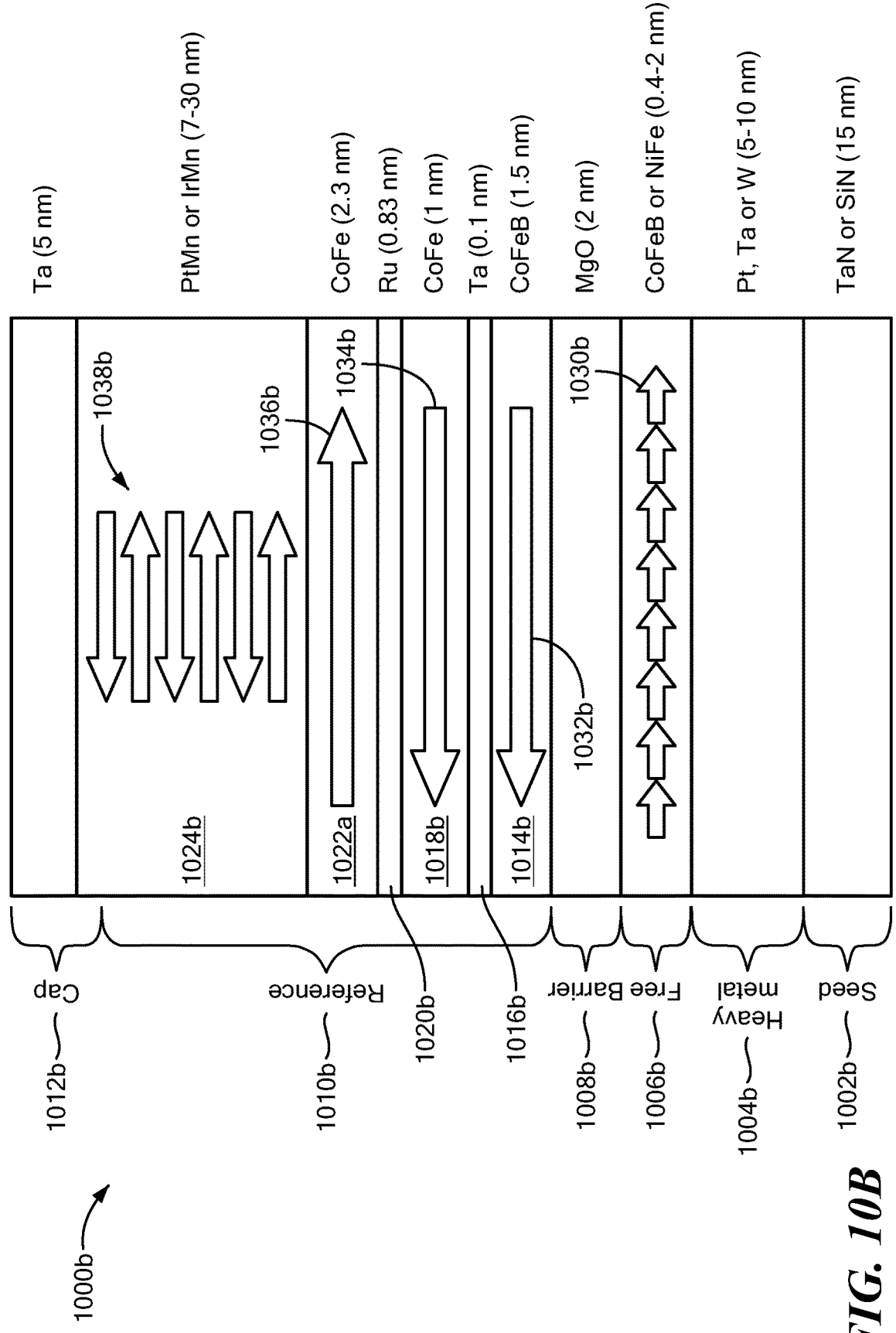

FIG. 10B shows an example of an illustrative TMR element 1000b that includes a heavy metal layer 1004b. In some implementations, the TMR element 1000b can be an example of the TMR element 812 of FIG. 8. The TMR element 1000b can have a stack of layers indicative of one pillar of a multi-pillar TMR element. The TMR element 1000b can include a seed layer 1002b (e.g., a tantalum nitride (TaN) or silicon nitride (SiN) layer), a heavy metal layer 1004b (e.g., a platinum (Pt), Tantalum (Ta), or Tungsten (W) layer), a free layer 1006b (e.g., a CoFeB or nickel iron (NiFe) layer), a barrier layer 1008b (e.g., a magnesium oxide (MgO) layer), a reference layer 1010b that can include a layer 1014b (e.g., a CoFeB layer), a layer 1016b (e.g., a Tantalum (Ta) layer), a layer 1018b (e.g., a CoFe layer), a layer 1020b (e.g., a ruthenium (Ru) layer), a layer 1022b (e.g., a CoFe layer), and a layer 1024b (e.g., a PtMn or iridium manganese (IrMn) layer), and a cap layer 1012b. In some implementations, the seed layer 1002b is about 15 nm in thickness, the heavy metal layer 1004b is about 5-10 nm in thickness, the free layer 1006b is about 0.4-2 nm in thickness, the barrier layer 1008b is about 2 nm in thickness, the layer 1014b is about 1.5 nm in thickness, the layer 1016b is about 0.1 nm in thickness, the layer 1018b is about 1 nm in thickness, the layer 1020b is about 0.83 nm in thickness, the layer 1022b is about 2.3 nm in thickness, the layer 1024b is about 7-30 nm in thickness, and the cap layer 1012b is about 5 nm in thickness, although other thicknesses are also possible.

In this example, the heavy metal layer 1004b is located on the seed layer 1002b, the free layer 1006b is located on the heavy metal layer 1004b, the barrier layer 1008b is located on the free layer 1006b, the reference layer 1010b is located on the barrier layer 1008b, and the cap layer 1012b is located on the reference layer 1010b. Depending on the application, in some implementations, the free layer 1006b and the reference layer 1010b may be in each other's position.

The layers have various magnetization directions associated with them, as illustrated by the arrows. Unlike the free layer 1006a of FIG. 10A, the free layer 1006b can have a magnetization 1030b that is rightwards and parallel to a top surface of the free layer 1006b and a direction of current flowing through the heavy metal layer 1004b. Such a magnetization 1030b can be appropriate when the TMR element 1000b is used in modulation/demodulation applications. The layer 1014b can have a magnetization 1032b that is leftwards and parallel to a top surface of the layer 1014b and the direction of current flowing through the heavy metal layer 1004b. The layer 1018b can have a magnetization 1034b that is leftwards and parallel to a top surface of the layer 1018b and the direction of current flowing through the heavy metal layer 1004b. The layer 1022b can have a magnetization 1036b that is rightwards and parallel to a top surface of the layer 1022b and the direction of current flowing through the heavy metal layer 1004b. The layer 1024b can have multiple magnetizations 1038b that are leftwards and rightwards and parallel to a top surface of the layer 1024b and the direction of current flowing through the heavy metal layer 1004b.

The heavy metal layers 1004a, 1004b are configured to generate a transversal spin current in the respective TMR element 1000a, 1000b in response to a current flowing through the heavy metal layers 1004a, 1004b, as described with respect to FIG. 9. The transversal spin current can be proportional to the current flowing through the heavy metal layer 1004a, 1004b. The transversal spin current can cause a resistance of the TMR element to change. The change of resistance can be indicative of a value of the current flowing through the heavy metal layer.

While various materials and thicknesses with respect to the layers of the TMR elements 1000a, 1000b have been described, it should be understood that other materials and/or other thicknesses and/or arrangements for the layers are also possible without departing from the spirit of the inventive concepts described herein.

While the magnetoresistance elements described herein have largely been described with respect to TMR elements, it should be understood that the systems and techniques described herein could apply to other types of magnetoresistance elements, such as GMR elements. In some implementations, a TMR element may be preferable for some systems and/or applications described due to the insulating nature of the TMR element's barrier layer, as described herein.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:
1. A sensor comprising:
a first metal layer portion and a second metal layer portion separated by an insulator material;

a conductive material layer in electrical contact with the first metal layer portion and the second metal layer portion; and a tunnel magnetoresistance (TMR) element positioned on and in electrical contact with the conductive material layer, wherein a first current is configured to flow from the first metal layer portion, through the conductive material layer, to the second metal layer portion, and wherein a second current is configured to flow from the first metal layer portion, through the conductive material layer, through the TMR element, and exiting through a top of the TMR element.

2. The sensor of claim 1, wherein the first current is also configured to flow through a bottom layer of the TMR element.

3. The sensor of claim 2, wherein the bottom layer of the TMR element is a reference layer.

4. A sensor comprising:
a first metal layer portion, a second metal layer portion, and a third metal layer portion each separated by an insulator material;
a conductive material layer in electrical contact with the first, second, and third metal layer portions; and
a tunnel magnetoresistance (TMR) element positioned on and in electrical contact with the conductive layer,
wherein a first current is configured to flow from the first metal layer portion, through the conductive material layer, to the third metal layer portion, and
wherein a second current is configured to flow from the second metal layer portion, through the conductive material layer, through the TMR element, and exiting through a top of the TMR element.

5. The sensor of claim 4, wherein the conductive material layer includes titanium nitride.

6. The sensor of claim 4, wherein the first current is also configured to flow through a bottom layer of the TMR element.

7. The sensor of claim 4, wherein the first current flows through a bottom layer of the TMR element, without passing through a barrier layer of the TMR element, and causes the bottom layer to increase in temperature beyond a blocking temperature of the TMR element such that current-induced degradation of the barrier layer does not occur.

8. The sensor of claim 4, wherein the first current is controlled to cause a bottom layer of the TMR element to remain at a constant temperature.

9. The sensor of claim 4, further comprising a thermal diode configured to monitor a temperature of a bottom layer of the TMR element.

10. The sensor of claim 9, wherein the bottom layer of the TMR element is a reference layer.

11. The sensor of claim 4, wherein the first current causes a planar magnetic field to be generated in the TMR element in a direction that is perpendicular to a direction of flow of the first current.

12. The sensor of claim 4, wherein the first current includes a modulation signal configured to modify a magnetic field signal received by the TMR element, and the sensor is configured to demodulate the modified signal to determine the magnetic field signal.

13. The sensor of claim 4, wherein the conductive material layer is a heavy metal layer that is configured to generate a transversal spin current in the TMR element in response to the first current.

14. The sensor of claim 13, wherein the transversal spin current causes a resistance associated with the TMR element to change.

15. The sensor of claim 14, wherein the sensor is configured to measure the first current based on a change in the resistance associated with the TMR element caused by the transversal spin current.

16. The sensor of claim 15, wherein the change in the resistance is based on a relative orientation between a magnetization of a free layer of the TMR element and a magnetization of a reference layer of the TMR element.

17. The sensor of claim 13, wherein the heavy metal layer includes one or more of platinum, tantalum, tungsten, and gold.

18. The sensor of claim 13, wherein the TMR element comprises:
a free layer positioned on the heavy metal layer;
a barrier layer positioned on the free layer; and
a reference layer positioned on the barrier layer.

19. The sensor of claim 18, wherein the barrier layer includes magnesium oxide (MgO).

20. The sensor of claim 18, wherein the TMR element comprises a seed layer positioned beneath the heavy metal layer and a capping layer positioned on the reference layer.

21. The sensor of claim 4, wherein the conductive material layer includes one or more coils.

22. A tunnel magnetoresistance (TMR) element comprising:
a heavy metal layer;
a free layer positioned on the heavy metal layer;
a barrier layer positioned on the free layer; and
a reference layer positioned on the barrier layer,
wherein the heavy metal layer is configured to generate a transversal spin current in the TMR element in response to a current flowing through the heavy metal layer, and wherein the transversal spin current is proportional to the current flowing through the heavy metal layer, and the transversal spin current causes a resistance of the TMR element to change.

23. The TMR element of claim 22, further comprising:
a seed layer positioned beneath the heavy metal layer; and
a capping layer positioned on the reference layer.

24. The TMR element of claim 22, wherein the barrier layer includes magnesium oxide (MgO).

25. The TMR element of claim 22, wherein the change of resistance is indicative of a value of the current flowing through the heavy metal layer.

\* \* \* \* \*